United States Patent
Rhodes et al.

(10) Patent No.: US 9,051,452 B2
(45) Date of Patent: Jun. 9, 2015

(54) POLYMER COMPOSITIONS FOR TEMPORARY BONDING

(71) Applicant: Promerus, LLC, Brecksville, OH (US)

(72) Inventors: Larry F Rhodes, Silver Lake, OH (US); Leah J Langsdorf, Akron, OH (US); Venkat Dukkipati, Westlake, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 14/105,324

(22) Filed: Dec. 13, 2013

(65) Prior Publication Data

US 2014/0102631 A1    Apr. 17, 2014

Related U.S. Application Data

(62) Division of application No. 13/339,784, filed on Dec. 29, 2011, now Pat. No. 8,633,259.

(60) Provisional application No. 61/427,859, filed on Dec. 29, 2010.

(51) Int. Cl.
| | |
|---|---|
| G03G 9/097 | (2006.01) |
| B41M 7/00 | (2006.01) |
| B29C 71/04 | (2006.01) |
| A61L 2/08 | (2006.01) |
| A61L 24/00 | (2006.01) |
| C08F 2/46 | (2006.01) |
| C08G 61/04 | (2006.01) |
| C08K 5/41 | (2006.01) |
| C08K 5/04 | (2006.01) |
| C08K 5/16 | (2006.01) |
| H01L 21/683 | (2006.01) |
| C08K 5/1535 | (2006.01) |
| C08K 5/5419 | (2006.01) |
| C08K 5/5425 | (2006.01) |
| C08K 5/548 | (2006.01) |

(52) U.S. Cl.
CPC ... *C08K 5/41* (2013.01); *C08K 5/04* (2013.01); *C08K 5/16* (2013.01); *H01L 21/6835* (2013.01); *H01L 2221/68327* (2013.01); *H01L 2221/6834* (2013.01); *H01L 2221/68381* (2013.01); *C08K 5/1535* (2013.01); *C08K 5/5419* (2013.01); *C08K 5/5425* (2013.01); *C08K 5/548* (2013.01)

(58) Field of Classification Search
CPC ........ C08K 5/41; C08K 5/548; C08K 5/5419; C08K 5/1535; C08K 5/5425; C08K 5/04; C08K 5/16; H01L 21/6835; H01L 2221/68327; H01L 2221/68381; H01L 2221/6834; C08L 101/00
USPC ................. 522/75, 74, 71, 189, 184, 1; 520/1
See application file for complete search history.

(56) References Cited

U.S. PATENT DOCUMENTS

| | | | |
|---|---|---|---|
| 7,052,821 B2 * | 5/2006 | Kohl et al. | 430/270.1 |
| 7,541,264 B2 | 6/2009 | Gardner et al. | |
| 7,713,835 B2 * | 5/2010 | Pillalamarri | 438/455 |
| 7,935,780 B2 | 5/2011 | Hong et al. | |
| 8,120,168 B2 * | 2/2012 | Apanius et al. | 257/710 |
| 2003/0113548 A1 * | 6/2003 | Corzani et al. | 428/423.1 |
| 2008/0173970 A1 | 7/2008 | Pillalamarri | |
| 2008/0200011 A1 | 8/2008 | Pillalamarri et al. | |
| 2009/0189277 A1 * | 7/2009 | Apanius et al. | 257/729 |
| 2009/0197067 A1 | 8/2009 | Naiini et al. | |
| 2010/0206479 A1 | 8/2010 | Pillalamarri et al. | |

FOREIGN PATENT DOCUMENTS

WO     WO2012092447 A1    7/2012

OTHER PUBLICATIONS

BASF, Photoacid Generator Selection Guide, 2010, pp. 2 and 12.*
International Search Report mailed Apr. 26, 2012 for PCT/US11/67761 filed Dec. 29, 2011.
Written Opinion of the International Searching Authority mailed Apr. 26, 2012 for PCT/US11/67761 filed Dec. 29, 2011.

* cited by examiner

*Primary Examiner* — Ling Choi
*Assistant Examiner* — Jessica E Whiteley
(74) *Attorney, Agent, or Firm* — Balaram Gupta

(57) ABSTRACT

Embodiments in accordance with the present invention are directed to poly(lactide) compositions that are useful for forming temporary bonding layers that serve to releasably join a first substrate to a second substrate as well as methods of both forming such a temporary bond and methods of debonding such substrates. Some such poly(lactide) compositions encompass a casting solvent, a photoacid generator and optionally a sensitizer and/or an adhesion promoter.

20 Claims, 1 Drawing Sheet

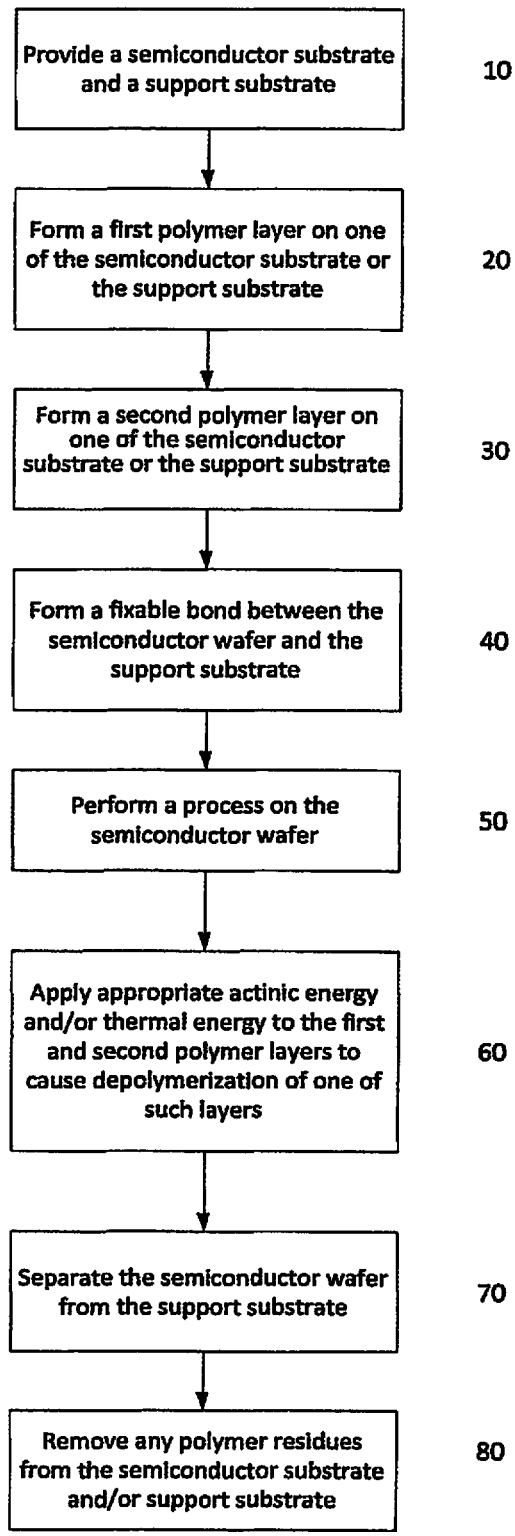

POLYMER COMPOSITIONS FOR TEMPORARY BONDING

CROSS-REFERENCE TO RELATED APPLICATION

This application is a divisional of U.S. application Ser. No. 13/339,784, filed Dec. 29, 2011, now allowed, which claims the benefit of U.S. Provisional Application No. 61/427,859 filed Dec. 29, 2010, both of which are incorporated herein by reference in their entirety.

TECHNICAL FIELD

The present invention relates generally to polymers that are useful for forming temporary or releasable bonds.

BACKGROUND

U.S. Pat. No. 7,713,835 (hereinafter '835), entitled "Thermally decomposable spin-on bonding compositions for temporary wafer bonding" issued May 11, 2010 to Brewer Science Inc., described problems associated with prior art methods and materials used to form temporary bonds between semiconductor wafers and carrier substrates. The '835 patent asserts that such prior art problems are overcome by providing a wafer bonding method where a stack comprising first and second substrates bonded together via a bonding composition layer is exposed to a temperature of at least about 285° C. and preferably from 350° C. to 400° C. so as to thermally decompose the bonding composition layer and cause the substrates to separate.

While such a decomposable material as disclosed by the '835 patent is likely to be useful for applications where a debonding temperature at or above 285° C. can be tolerated by wafers and substrates, many applications where a temporary or releasable bond would be useful cannot withstand such elevated temperatures. Therefore it would be advantageous to provide spin-on bonding compositions for temporary wafer bonding that can be debonded at temperatures at or below a temperature employed for forming such a bond, where such temperature is at or below 200° C.

BRIEF SUMMARY OF THE DRAWINGS

FIG. 1 depicts a flow chart of a processing method embodiment in accordance with the present invention.

DETAILED DESCRIPTION

Described herein are materials that can form releasable or temporary bonds, where at a first temperature the materials remain in a fixed mode during one or more desired process steps and subsequently are made releasable at a second temperature equal to or lower than the first temperature. Embodiments in accordance with the present invention are generally directed to providing polymer compositions that are capable of forming films for use as a temporary (or releasable) bonding layer useful in the manufacture of microelectronic and optoelectronic devices.

Embodiments in accordance with the present invention are directed to providing polymer compositions, such as poly(lactide) compositions, and non-poly(lactide) polymer compositions that are capable of forming films for use as a temporary (or releasable) bonding layer useful in the manufacture of microelectronic and optoelectronic devices. In some embodiments, such polymer compositions are capable of forming a bonding layer having a thickness in excess of 30 microns with a single coating operation, where such a bonding layer maintains a fixed bond, once formed, that exhibits thermal stability to temperatures of at least 200° C. while allowing for debonding at temperatures at or below 200° C. after an appropriate exposure to actinic radiation.

Other embodiments in accordance with the present invention are directed to providing multi-layered films, such as a poly(lactide) layer and at least one other non-poly(lactide) polymer layer or two non-poly(lactide) polymer layers that are capable of forming multi-layered films for use as a temporary (or releasable) bonding layer useful in the manufacture of microelectronic and optoelectronic devices. In such embodiments, such multi-layered films encompass a bonding layer that exhibits thermal stability at a first temperature, such as at least 200° C., while allowing for debonding at a second temperatures, typically below the first temperature such as at or below 200° C. Such debonding being the result of one layer being depolymerized under specific conditions such as exposure to actinic radiation and/or heating to the aforementioned second temperature.

Unless otherwise indicated, all numbers, values and/or expressions referring to quantities of ingredients, reaction conditions, etc., used herein are to be understood as modified in all instances by the term "about" as absent the aforementioned indication, such numbers are approximations reflective of, among other things, the various uncertainties of measurement encountered in obtaining such values. Further, where a numerical range is disclosed herein such range is continuous, and includes every value between the minimum and maximum values of such range. Still further, where a range refers to integers, every integer from the minimum to the maximum values of such range is included. In addition, where multiple ranges are provided to describe a feature or characteristic, such ranges can be combined.

As used herein, the terms "polymer composition", "poly(lactide) composition" and "non-poly(lactide) composition" are meant to include one or more synthesized polymers, as well as residues from initiators, catalysts, and other elements attendant to the synthesis of such polymer(s) or the forming of such polymer compositions, where such residues are understood as not being covalently incorporated thereto. Such residues and other elements considered as part of the polymer composition are typically mixed or co-mingled with the polymer(s) such that they tend to remain therewith when it is transferred between vessels or between solvent or dispersion media. A polymer composition can also include materials added after synthesis of the polymer(s) to provide to or modify specific properties of such a composition.

As used herein, the term "PLA" refers to substituted and unsubstituted poly(lactides). As used herein, the term "NPL" refers to substituted and unsubstituted polymers where the polymer is not a poly(lactide) nor contains lactide repeat units.

Where such PLAs or NPLs are referred to as being substituted, such reference will be understood to mean that at least one of the lactide repeating units or other polymer repeating units encompasses a hydrocarbyl substituent having from 1 to 12 carbon atoms. Where, as used herein, the term "hydrocarbyl" refers to a radical or a group that generally contains only carbon and hydrogen atoms. Non-limiting examples of such hydrocarbyl groups being alkyl or cycloalkyl.

It will also be understood that some embodiments in accordance with the present invention may include "heterohydrocarbyl" groups where such term refers to any of the previously described hydrocarbyls, where at least one carbon atom of the carbon chain is replaced with N, O, S, Si or P. It will additionally be understood that any of the hydrocarbyl or heterohydrocarbyl moieties described above can be further substituted, if desired.

The polymer composition embodiments in accordance with the present invention that are capable of forming temporary bonding layers exhibit controllable bonding or adhesive differences that permit relatively strong bonding between two structures under a first set of conditions and relatively weak bonding between the two structures under a second set of conditions. Examples of polymers suitable for use in such polymer compositions include, but are not limited to, homopolymers having only one lactide-type repeating units, polymers having two or more lactide-type repeating units, and polymers having lactide repeating units and repeating units derived from other types of monomers.

PLAs are commercially available under the trade designation Ingeo™ from NatureWorks LLC of Minnetonka, Minn.; and under the trade designation PURASORB® from Purac of Gorinchem, The Netherlands. Specific examples of PLAs from Purac include PLDL 7017 (70% L-lactide and 30% DL-lactide with an inherent viscosity midpoint of 1.7 dl/g), PLDL7025 (70% L-lactide and 30% DL-lactide with an inherent viscosity midpoint of 2.5 dl/g), PLDL7038 (70% L-lactide and 30% DL-lactide with an inherent viscosity midpoint of 3.8 dl/g), and PDL20 (100% DL-lactide with an inherent viscosity midpoint of 2.0 dl/g).

Alternatively, PLAs can be made using known techniques. For example, by a tin-catalyzed ring-opening polymerization. An example of such a tin catalyst is Sn(II) octanoate which has been found useful for bulk polymerization of lactide monomers. Such tin catalysts have high catalytic activity, a low rate of racemization of the polymer and provide conversions greater than 90% with high Mw. Typical conditions for such ring-opening polymerizations are temperatures from 180 to 210° C., from 100-1000 ppm of the tin catalyst and a reaction time of from 2 to 5 hours. Monomers useful for forming the polymer embodiments in accordance with the present invention include substituted and unsubstituted lactides. When such monomers are substituted, a hydrocarbyl group having 1 to 12 carbons is typically the substituent. It should be noted that lactides monomers have stereochemical differences that can be exploited to control and or modify the thermal, barrier, and solubility properties of subsequently formed polymers. For example, different monomers (or different amounts of selected monomers) can be employed to tailor desired properties of a given, subsequently formed polymer. Thus where polymers rich in L-lactide are formed, such polymers tend to be crystalline while polymers formed with more than 15% D-lactide tend to be more amorphous. The chemical structures of various types of lactide monomers are shown below.

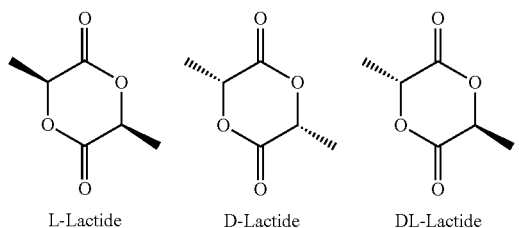

L-Lactide     D-Lactide     DL-Lactide

As used herein, and unless otherwise stated, thermogravimetric analysis (TGA), here at a heating rate of 10° C./minute, is reported as a measure of the thermal stability of the variety of Purac polylactides encompassed by the embodiments in accordance with the present invention. Specifically the $Td_5$, $Td_{50}$ and $Td_{95}$ values, indicative that 5, 50 and 95 weight percent (wt. %) of a polymer has been determined to have decomposed (lost by vaporization). Additionally, values for, representing the temperatures where 50 wt. % and 95 wt. % of a polymer has been determined to have decomposed are also provided herein and are indicative of the thermal stability of a polymer as seen in Table 1, below:

TABLE 1

| Polymer | Composition | Td (5%) | Td (50%) | Td (95%) |
| --- | --- | --- | --- | --- |
| PLDL7038 | Polymer of L-lactide and DL-lactide 70/30 | 297° C. | 347° C. | 367° C. |
| PLDL 7025 | Polymer of L-lactide and DL-lactide 70/30 | 329° C. | 363° C. | 380° C. |
| PDL20 | Polymer of DL-lactide | 327° C. | 362° C. | 380° C. |

Useful types of monomers for embodiments in accordance with the present invention are described generally above and further described by the types of monomer structures provided herein. For some embodiments in accordance with the present invention, the polymer composition encompasses a blend of two or more PLA polymers where such polymers can be homopolymers or not. That is to say that such polymers can have one type of repeating unit or more than one type of repeating unit, respectively. In other embodiments, the polymer composition encompasses only one PLA polymer where such polymer can be a homopolymer or not. In one exemplary embodiment, the polymer composition encompasses about 70 mole percent L-lactide and about 30 mole percent DL-lactide by weight of the composition (PLDL7025).

It should also be noted that polymer embodiments that encompass repeating units derived from monomers other than lactide-type monomers are contemplated herein. Further, polymer composition embodiments that encompass both lactide-type polymers and polymers having both repeating units derived from lactide-type monomers and non-lactide-type monomers are also contemplated herein. For example, a polymer composition in accordance with the present invention can encompass a first polymer having one or more repeating units derived only from lactide-type monomers as well as a second polymer encompassing one or more repeating units derived from lactide-type repeating units and one or more repeating units derived from non-lactide-type repeating units. Also encompassed are embodiments where multi-layered films are provided, where at least one polymer layer contains a PLA polymer and at least one polymer layer contains a NPL polymer.

It should further be noted that polymer embodiments of single layered films encompass NPL polymers. Examples of NPL polymers for single layered temporary bonding films include polycarbonates, polyesters, polyamides, polyethers, polymethacrylates, polynorbornenes, alkyl celluloses and combinations of two or more thereof. Also encompassed are embodiments where multi-layered films are provided, where at least one polymer layer contains a NPL polymer and at least one polymer layer contains a different NPL polymer.

Examples of NPL polymers include polycarbonates, polyesters, polyamides, polyethers, polymethacrylates, polynorbornenes, alkyl celluloses and combinations of two or more thereof. That is, NPL polymers can contain repeat units from one or more of polycarbonates, polyesters, polyamides, polyethers, polymethacrylates, and polynorbornenes.

Examples of polycarbonates include, but are not limited to, propylene carbonate, ethylene carbonate, 1,2-butylene carbonate, 1,3-butylene carbonate, 1,4-butylene carbonate, cis- 2,3-butylene carbonate, trans-2,3-butylene carbonate, α,β-isobutylene carbonate, α,γ-isobutylene carbonate, cis-1,2-cyclobutylene carbonate, trans-1,2-cyclobutylene carbonate, cis-1,3-cyclobutylene carbonate, trans-1,3-cyclobutylene carbonate, hexene carbonate, cyclopropene carbonate, cyclohexene carbonate, (methylcyclohexene carbonate), (vinylcyclohexene carbonate), dihydronaphthalene carbonate, hexahydrostyrene carbonate, cyclohexane propylene carbonate, styrene carbonate, (3-phenylpropylene carbonate)(3-trimethylsilyloxypropylene carbonate)(3-methacryloyloxypropylene carbonate), perfluoropropylene carbonate, norbornene carbonate, polypropylene carbonate/polycyclohexene carbonate copolymer, poly[(oxycarbonyloxy-1,1,4,4-tetramethyl butane)-alt-(oxycarbonyloxy-5-norbornene-2-endo-3-endo-dimetan)], poly[(oxycarbonyloxy-1,4-dimethyl butane)-alt-(oxycarbonyloxy-5-norbornene-2-endo-3-endo-dimetan)], poly[(oxycarbonyloxy-1,1,4,4-tetramethyl butane)-alt-(oxycarbonyloxy-p-xylene)], poly[(oxycarbonyloxy-1,4-dimethyl butane)-alt-(oxycarbonyloxy-p-xylene)], polycyclohexene carbonate/polynorbornene carbonate copolymer, and combinations of two or more thereof.

Examples of polyesters include, but are not limited to, amorphous copolyesters such as RV270 and GK880 both obtained from Toyobo America, Inc., and polyesters formed from monomers such as 1,3-cyclohexanedicarboxylic acid, 1,4-cyclohexanedicarboxylic acid and 2,2-dimethyl-1,3-propanediol (Sigma Aldrich).

Examples of polymethacrylates include, but are not limited to, methyl methacrylate-methacrylic acid (80/20) copolymer (Monomer-Polymer & Dajac Labs, Trevose, Pa., product number 9425) and methyl methacrylate-butyl acrylate triblock copolymers such as LA 2250, LA 4285 and LA 2140e available from Kuraray America, Inc, Examples of alkylcelluloses include, but are not limited to, methylcellulose, ethylcellulose and hydroxy propylcellulose all available from Sigma Aldrich.

For some embodiments in accordance with the present invention, the weight average molecular weights (Mw) of such NPLs, is in the range of 1,000 to 1,000,000. In other embodiments, the Mw is from 5,000 to 700,000 and in still others from 10,000 to 500,000. Weight average molecular weights that are not below 1,000 typically provide one or more advantageous effects including: improved wettability of the fixed polymer layer to the semiconductor wafer or support substrate, and improved film-forming properties. Weight average molecular weights that are not higher than 1,000,000 typically provide one or more advantageous effects including: improved compatibility of the polymer to various components in the fixed polymer layer and the solubility thereof to various solvents, and improved thermal decomposability of the fixed polymer layer in a debonding act (such as separating a wafer from a substrate).

Methods of polymerizing polycarbonate polymers include art-recognized methods, such as, a phosgene method (solvent method) and a transesterification method (melting method) among others.

Examples of norbornene-type polymers that can be used herein include those having structural units represented by the following general formula (1):

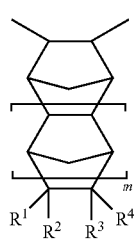

(1)

With reference to formula (1), m is an integer of 0 to 4; and $R^1$, $R^2$, $R^3$ and $R^4$ each represent a hydrogen atom, or a hydrocarbyl pendent group containing from 1 to 20 carbon atoms, such as a linear or branched alkyl group, an aromatic group, or an alicyclic group having 1 to 20 carbon atoms; a halohydrocarbyl containing from 1 to 20 carbon atoms; a perhalocarbyl containing from 1 to 20 carbon atoms; and silicon containing hydrocarbyl group such as a substituent represented by the following general formula (2).

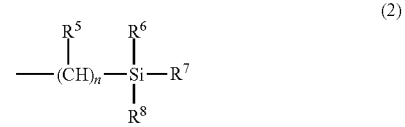

(2)

With reference to formula (2), each $R^5$ independently represents a hydrogen atom, a methyl group, or an ethyl group; $R^6$, $R^7$, and $R^8$ each independently represent a linear or branched alkyl group having 1 to 20 carbon atoms, a linear or branched alkoxy group having 1 to 20 carbon atoms, a linear or branched alkylcarbonyloxy group having 1 to 20 carbon atoms and a substituted or unsubstituted aryloxy group having 6 to 20 carbon atoms; and n is an integer of 0 to 5.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, I). The term perhalocarbyl refers to a hydrocarbyl group where each hydrogen has been replaced by a halogen. Non-limiting examples of hydrocarbyls, include, but are not limited to a linear or branched $C_1$-$C_{20}$ alkyl, a linear or branched $C_2$-$C_{20}$ alkenyl, a linear or branched $C_2$-$C_{20}$ alkynyl, a linear or branched $C_5$-$C_{25}$ cycloalkyl, an $C_6$-$C_{20}$ aryl, or an $C_7$-$C_{20}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, and phenethyl.

The term halohydrocarbyl as used throughout the present specification is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation.

In other embodiments in accordance with the invention, one or more of $R^1$, $R^2$, $R^3$, and $R^4$ is a linear or branched $C_1$ to $C_{20}$ hydrocarbyl, halohydrocarbyl or perhalocarbyl pendent group, where such hydrocarbyl, halohydrocarbyl or perhalocarbyl group encompasses one or more heteroatoms selected from O, N, S, P and Si, and the others of $R^1$, $R^2$, $R^3$, and $R^4$ are H. Exemplary groups encompassing heteroatoms include, among others, a triethoxysilyl group a methanol acetate group, a t-butylcarboxylate group and a hindered phenol group such as represented by structural formula A:

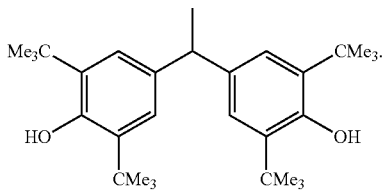

For embodiments in accordance with the present invention, when a linear or branched alkyl pendent group having 1 to 20 carbon atoms is selected from butyl, hexyl and decyl, the repeating units encompassing such alkyl pendent groups provide desirable properties to the polymer such as one or more of excellent compatibility with various components of a temporary bonding agent, solubility with various kinds of solvents, and mechanical physical properties when bonding together a semiconductor wafer and a support substrate. Similarly, for embodiments, having aromatic pendent groups such as phenethyl and naphthyl, or alicyclic pendent groups such as cyclohexyl and norbornyl, desirable physical properties are also obtained.

For embodiments in accordance with the present invention that encompass pendent groups represented by formula (2), when the $R^5$ group is hydrogen, desirable physical properties are also obtained. For some embodiments encompassing pendent groups represented by for formula (2), when $R^6$, $R^7$, and $R^8$ are each independently selected from methoxy, ethoxy, and propoxy, desirable physical properties are also obtained, for example excellent adhesion to a support substrate. For some embodiments encompassing pendent groups represented by for formula (2), when n is 0 and the silyl group is directly bonded to a polycyclic ring via a silicon-carbon bond, the resultant polymer layer also can provide desirable properties.

Norbornene-type polymers useful for method embodiments in accordance with the present invention can include a single type of repeat unit or a plurality of different types of repeat units, each type of repeat unit being represented by the above formula (1).

Exemplary norbornene-type polymers having a single type of repeat unit, also referred to as homopolymers, include but are not limited to polynorbornene, poly(methyl norbornene), poly(ethyl norbornene), poly(butyl norbornene), poly(hexyl norbornene), poly(decyl norbornene), poly(phenethyl norbornene), poly(triethoxysilyl norbornene), poly(trimethylsilyl norbornene), poly(trimethoxysilyl norbornene), poly(methyldimethoxysilyl norbornene) and poly(dimethyl methoxy norbornene). Exemplary norbornene-type polymers having two or more types of repeat units include, but are not limited to, a norbornene/triethoxysilyl norbornene polymer, a butyl norbornene/triethoxysilyl norbornene polymer, and a decyl norbornene/triethoxysilyl norbornene polymer.

The weight average molecular weight ($M^w$) of norbornene-type polymers in accordance with embodiments of the present invention can be from 5,000 to 1,000,000 Dalton, from 25,000 to 750,000 Dalton or from 40,000 to 500,000 Dalton. For the above ranges of molecular weight, it will be understood that such values are obtained using polystyrene standards for gel permeation chromatography (GPC) with tetrahydrofuran (THF) as a solvent.

Norbornene polymers having structural units represented by the above general formula (1) can be prepared by known methods including, for example, vinyl addition polymerization methods.

Further to the polymer composition embodiments in accordance with the present invention, such compositions encompass a polymer embodiment, a casting solvent and optionally a photosensitizer, a photoacid generator (PAG) and/or an adhesion promoter. In embodiments where the bonding layer contains multi-layered polymer films, at least one polymer layer generally contains a PAG. In some embodiments, the polymer compositions, whether PLA or NPL polymer compositions, contain from 5 to 50 wt. % polymer and from 0 to 5 wt. % PAG. In other embodiments, the polymer compositions, whether PLA or NPL polymer compositions, contain from 10 to 40 wt. % polymer, from 0.05 to 2 wt. % PAG.

PAGs useful for the polymer composition embodiments of the present invention can be selected from triphenylsulfonium salts such as triphenylsulfonium tris[(trifluoromethyl)sulfonyl]methanide; triphenylsulfonium 4,4,5,5,6,6-hexafluorodihydro-4H-1,3,2-dithiazine 1,1,3,3-tetraoxide (TPS N3); and triphenylsulfonium tris[(trifluoromethyl)sulfonyl]methanide (TPS C1); thio aromatic acyl substituted triphenylsulfonium salts such as tris[4-[(4-acetylphenyl)thio]phenyl]sulfonium tris[(trifluoromethyl)sulfonyl]methanide (GSID26-1); and naphthalene substituted sulfonium salts such as (2-(4-methoxynaphthalen-1-yl)-2-oxoethyl)dimethylsulfonium tetrakis(pentafluorophenyl)borate (TAG 382); (2-(4-methoxynaphthalen-1-yl)-2-oxoethyl)dimethylsulfonium tris[(trifluoromethyl) sulfonyl]methanide; and (2-(4-methoxynaphthalen-1-yl)-2-oxoethyl)dimethylsulfonium trifluorotris(1,1,2,2,2-pentafluoroethyl)phosphate.

Other ionic PAGs include triphenylsulfonium tetrakis(pentafluorophenyl)borate; triphenylsulfonium hexafluorophosphate; triphenylsulfonium hexafluoroantimonate; triphenylsulfonium nonafluorobutane sulfonate; triphenylsulfonium trifluoromethanesulfonate; triphenylsulfonium 1,1,1-trifluoro-N-[(trifluoromethyl)sulfonyl]methanesulfonamide (TPS N1); tris(4-t-butylphenyl)sulfonium tetrakis(pentafluorophenyl)borate; tris(4-t-butylphenyl)sulfonium hexafluorophosphate; tris(4-t-butylphenyl)sulfonium hexafluoroantimonate; tris(4-t-butylphenyl)sulfonium nonafluorobutane sulfonate; tris(4-t-butylphenyl)sulfonium trifluoromethanesulfonate; tris(4-t-butylphenyl)sulfonium 1,1,1-trifluoro-N-[(trifluoromethyl)sulfonyl]methanesulfonamide; tris(4-t-butylphenyl)sulfonium tris[(trifluoromethyl)sulfonyl]methanide; triphenylsulfonium 4,4,5,5,6,6-hexafluorodihydro-4H-1,3,2-dithiazine 1,1,3,3-tetraoxide; tris(4-t-butylphenyl)sulfonium tris[(trifluoromethyl)sulfonyl]methanide; tris[4-[(4-acetylphenyl)thio]phenyl]sulfonium tetrakis(pentafluorophenyl)borate; tris[4-[(4-acetylphenyl)thio]phenyl]sulfonium hexafluorophosphate; tris[4-[(4-acetylphenyl)thio]phenyl]sulfonium hexafluoroantimonate; tris[4-[(4-acetylphenyl)thio]phenyl]sulfonium nonafluorobutane sulfonate; tris[4-[(4-acetylphenyl)thio]phenyl]sulfonium trifluoromethanesulfonate; tris[4-[(4-acetylphenyl)thio]phenyl]sulfonium 1,1,1-trifluoro-N-[(trifluoromethyl)sulfonyl]methanesulfonamide; tris[4-[(4-acetylphenyl)thio]phenyl]sulfonium 4,4,5,5,6,6-hexafluorodihydro-4H-1,3,2-dithiazine 1,1,3,3-tetraoxide; tris[4-[(4-acetylphenyl)thio]phenyl]sulfonium tris[(trifluoromethyl)sulfonyl]methanide; (2-(4-methoxynaphthalen-1-yl)-2-oxoethyl)dimethylsulfonium hexafluorophosphate; (2-(4-methoxynaphthalen-1-yl)-2-oxoethyl)dimethylsulfonium hexafluoroantimonate; (2-(4-methoxynaphthalen-1-yl)-2-oxoethyl)dimethylsulfonium nonafluorobutane sulfonate; (2-(4-methoxynaphthalen-1-yl)-2-oxoethyl)dimethylsulfonium trifluoromethanesulfonate; (2-(4-methoxynaphthalen-1-yl)-2-oxoethyl)dimethylsulfonium 1,1,1-trifluoro-N-[(trifluoromethyl)sulfonyl]methanesulfonamide; (2-(4-methoxynaphthalen-1-yl)-2-oxoethyl)dimethylsulfonium 4,4,5,5,6,6-hexafluorodihydro-4H-1,3,2-dithiazine 1,1,3,3-tetraoxide; (2-(4-methoxynaphthalen-1-yl)-2-oxoethyl)dimethylsulfonium tris[(trifluoromethyl)sulfonyl]methanide; 5-phenyl-thianthrenium tetrakis(pentafluorophenyl)borate; 5-phenyl-thianthrenium hexafluorophosphate; 5-phenyl-thianthrenium hexafluoroantimonate; 5-phenyl-thianthrenium nonafluorobutane sulfonate; 5-phenyl-thianthrenium trifluoromethanesulfonate; 5-phenyl-thianthrenium 1,1,1-trifluoro-N-[(trifluoromethyl)sulfonyl]methanesulfonamide; 5-phenyl-thianthrenium tris[(trifluoromethyl)sulfonyl]methanide; 5-phenyl-thianthrenium 4,4,5,5,6,6-hexafluorodihydro-4H-1,3,2-dithiazine 1,1,3,3-tetraoxide; 5-phenyl-thianthrenium tris[(trifluoromethyl)sulfonyl]methanide; 1,4-phenylenebis[diphenylsulfonium]tetrakis (pentafluorophenyl)borate; 1,4-phenylenebis[diphenylsulfonium]hexafluorophosphate; 1,4-phenylenebis[diphenylsulfonium]hexafluoroantimonate; 1,4-phenylenebis[diphenylsulfonium]nonafluorobutane sulfonate; 1,4-phenylenebis[diphenylsulfonium]trifluoromethanesulfonate; 1,4-phenylenebis[diphenylsulfonium] 1,1,1-trifluoro-N-[(trifluoromethyl)sulfonyl]methanesulfonamide; 1,4-phenylenebis[diphenylsulfonium]tris [(trifluoromethyl)sulfonyl]methanide; 1,4-phenylenebis[diphenylsulfonium]4,4,5,5,6,6-hexafluorodihydro-4H-1,3,2-dithiazine 1,1,3,3-tetraoxide; 1,4-phenylenebis[diphenylsulfonium]tris[(trifluoromethyl)sulfonyl] methanide.

Additionally, non-ionic PAGs such as CGI-1906: 2-[2,2,3,3,4,4,4-heptafluoro-1-(nonafluorobutylsulfonyloxyimino)-butyl]-fluorene; and CGI-1907: 2-[2,2,3,3,4,4,5,5-octafluoro-1-(nonafluorobutylsulfonyloxyimino)-pentyl]-fluorene can also be useful.

Examples of photosensitizers include anthracenes, phenanthrenes, chrysenes, benzpyrenes, fluoranthenes, rubrenes, pyrenes, xanthones, indanthrenes, thioxanthen-9-ones, or mixtures thereof. More specifically anthracene-9-carboxylic acid can be useful as a sensitizer and 9,10-dibutoxyanthracene, 9,10-diethoxyanthracene, 1-chloro-4-propoxythioxanthone and chlorothioxanthone can also be useful photosensitizers. It should be noted that where a methacrylate polymer is selected for forming a polymer layer, such polymers do not generally require the addition of a PAG to cause depolymerization. Rather generally only a photosensitizer additive is needed to provide activation of the depolymerization reaction at a desired wavelength of actinic radiation.

Exemplary casting solvents include, among others, N-methyl-pyrrolidone (NMP), propylene glycol monomethyl ether acetate (PGMEA), gamma-butyrolactone (GBL), and di-methyl-acetamide (DMAc). Other casting solvents include, mixtures of PGME with PGMEA and mixtures of PGME with ethyl lactate. Still other casting solvents include, glycerol, dibutylether, ethyl lactate dibutylglycerol, dimethyl sulfoxide (DMSO), dimethylformamide (DMF), high boiling aromatic-based solvents, petroleum ether, the carbitol family, dipropyleneglycol and the glycol ether family, isobutyl alcohol (IBA), methyl isobutyl carbinol (MIBC), propylene glycol monomethyl ether (PGME), and mixtures thereof.

Examples of adhesion promoters include bis[(3-triethoxysilyl)propyl]disulfide (trade designation SIB 1824.6), allyl trimethoxysilane (trade designation SIA 0540), 1,6-bis(trimethoxysilyl)hexane (trade designation SIB 1832). SIB 1824.6, SIA 0540, and SIB 1832 are commercially available from Gelest, Inc.

Some embodiments in accordance with the present invention are directed to casting a polymer composition embodiment of the present invention onto a surface of a substrate to form a bonding layer thereon (or on a previously applied polymer layer). Generally such casting is accomplished using processes such spin coating, spray coating, doctor blading and the like, followed by a baking step for removing essentially all of the casting solvent.

The polymer composition embodiments described herein are particularly effective at forming relatively thick bonding layers (in some embodiments over 100 μm thick) on a substrate in a single casting application, thus making multiple casting applications unnecessary for most desired thicknesses. However, multiple casting applications can be employed when different polymer layers (polymer layers with different characteristics) are desired and/or advantageous.

In embodiments where a multi-layered film containing at least two different polymer layers is employed one of many alternatives can be selected for forming the bonded structure. For example, a PLA layer can be formed on a first substrate and a NPL layer is then formed on the PLA layer, followed by a second substrate attached to the NPL layer. Or a NPL layer can be formed on a first substrate and a PLA layer is then formed on the NPL layer, followed by a second substrate attached to the PLA layer. Alternatively, a PLA layer can be formed on a first substrate and a NPL layer can be formed on a second substrate, and the two substrates are bonded together via the PLA layer and NPL layer. Still alternatively, a NPL layer can be formed on a first substrate and a PLA layer can be formed on a second substrate, and the two substrates are bonded together via the NPL layer and PLA layer. For brevity additional permutations relating to multi-layered films containing at least three or more different polymer layers are not described.

It has been found that a bonding layer formed from a polymer composition embodiment or multi-layered film of the present invention can be used to form a thermal compression bond between surfaces of two substrates. Such thermal compression bonding employing a first temperature and a first pressure maintained for an appropriate period of time. It will be understood that such first temperature, pressure and time period are a function of the specific polymer used to form the layer, as well as the layer's thickness. It will also be understood that the selection of such a specific polymer or specific polymer layers within a multi-layered film is determined in significant part by the type of substrates to be bonded as well as the nature of any processing that will be performed after such bonding is completed. For example, where a semiconductor wafer is to be bonded to a carrier substrate to allow for the wafer's thickness to be reduced, a bonding layer thickness of 5 to 60 microns (or 2 to 50 microns per layer of a multi-layered film) is generally appropriate and bonding temperatures and pressures can be from 70° C. to 260° C. and 0.01 MPa to 10 MPa, respectively. However, where, for example singulated semiconductor die having electrical connectivity means (e.g., solder balls or bumps) are disposed over a surface for bonding such die to a carrier substrate, the thickness of the bonding layer is selected to be slightly greater than the dimension of such electrical conductivity means so that such means remain undamaged during the forming of the temporary bond.

In multi-layered film embodiments, the thermal decomposition temperature of one layer is lower than the thermal decomposition temperature of a second layer. The thermal decomposition temperature can be lowered by an external stimulus such as exposure to actinic radiation or an active chemical species.

Once formed, the bonding layer has a first set of properties related to the specific polymer selected for the polymer composition or at least polymer layer of a multi-layered film that is cast to form such a layer(s). These properties include one or more of $T_{mwl}$ (temperature of molecular weight lowering) weight average molecular weight ($M_w$), viscosity, $T_g$ (glass transition temperature), solubility, adhesion, or any other property that enables the layer(s) to bond one substrate to one another and then, after exposure to a desired amount of actinic radiation at an appropriate wavelength, allow for debonding of such substrates. Such an appropriate wavelength of such actinic radiation is typically from 150 nm to 700 nm, where generally a wavelength of 157 nm, 193 nm, 248 nm, 365 nm, 405 nm, 436 nm, and 633 nm is selected. With regard to the amount of actinic radiation, generally from 1 to 2 Joules per square centimeter ($J/cm^2$) are appropriate although higher or lower amounts may also be useful.

For polymer composition embodiments of the present invention that incorporate a PAG therein, the bonding layers formed thereof are sensitive to actinic radiation. It has been found that for such embodiments, exposing such a bonding layer to an appropriate wavelength of radiation results in a substantial lowering of the polymer's original molecular weight ($M_w$). Advantageously, this lowering of molecular weight results in a lowering of the polymer's viscosity thus allowing for debonding of any substrates previously attached to one another through such a bonding layer. For some embodiments, the lowering of the molecular weight has been found to be as much as an order of magnitude. For other embodiments, the lowering of molecular weight has been found to be about one half of the original molecular weight.

As it will be shown hereinafter, exposure of the bonding layer to actinic radiation does not cause the polymer therein to decompose and release gaseous by-products. Rather, it is believed that where a PAG is added to a polymer the acid formed from the exposure of the included PAG to the aforementioned actinic radiation causes some bond cleavage in the polymer backbone to occur thus resulting in the observed lowering of the polymer's $M_w$ and the decreased viscosity that allows for debonding. Such a process is referred to herein as depolymerization.

Polymeric decomposition, as observed for other temporary bonding materials is, however, necessarily accompanied by the release of gaseous by-products. Such gaseous by-products can result in contamination of one or both of the bonded substrates thus causing a loss of yield or reduced reliability for a product made using such materials. However, the molecular weight lowering of the instant polymer embodiments is believed to be advantageous over such prior art temporary bonding layers as the aforementioned contamination is essentially eliminated by the absence of such gaseous by-products. Further, any portions of the layer having the lowered molecular weight that remain attached to one or both substrates after debonding, by either a slide-off or a wedge debonding method, have been found to be readily removed by washing with an appropriate solvent or solution.

Referring to FIG. 1, a flow chart depicting a method of processing a semiconductor structure in accordance with on aspect of the invention is shown. FIG. 1 more specifically depicts the method where a multilayered bonding film is employed to temporarily join two structures. Beginning at Act 10, two substrates are provided, such as a semiconductor substrate or wafer and a support substrate. Act 20 involves forming a first polymer layer on one of the two substrates; that is, on one of the semiconductor substrate or the support substrate. Act 30 involves the optional forming of a second polymer layer on one of the two substrates. The second polymer layer can be formed over the first polymer layer that is already formed or the second polymer layer can be directly formed on the semiconductor substrate or the support substrate that does not have the first polymer layer already formed thereon. Act 40 involves forming a fixable bond between the two substrates; that is, between the semiconductor substrate and the support substrate. Regardless of how Act 30 is performed (regardless of where the second polymer layer is initially formed), the two substrates are bonded such that the first polymer layer and, if present, the second polymer layer are adjacent each other and are positioned between the two substrates. Act 50 involves performing one or more processes on one of the substrates, typically the semiconductor substrate. The processes are typically those performed during semiconductor processing and can include one or more of etching, thinning, depositing materials, patterning materials, forming structures such as through silicon vias (TSVs), attaching structures, removing structures, testing structures, and the like. Act 60 involves applying an appropriate stimulus, such as actinic energy and/or thermal energy, to the polymer layer(s) to cause depolymerization of at least one of such layers. Act 70 involves separating the two semiconductor substrates from each other; that is, separating the semiconductor wafer from the support substrate.

Separation is done in a non-destructive manner such that one or both of the two substrates are not irreparably damaged as a result of the separation act. Advantageously, where two polymer layers are formed, it has been found that causing depolymerization of the polymer layer adjacent the support substrate is effective in preventing damage to the semiconductor substrate. Act 80 involves removing any polymer residues from the two substrates. In the case of separating a semiconductor substrate from a support substrate, although polymer residues can be removed from both semiconductor substrate and support substrate, for some embodiments polymer residues can be removed from only the semiconductor substrate.

In the presentation of the following experimental data, abbreviations are used to simplify the naming of polymers, casting solvents and PAGs. The abbreviations used below coordinate with the names and abbreviations previously provided for each of the polymers, casting solvents and PAGs. It will also be understood that while specific details for the spin-coating of the exemplary polymer composition embodiments below are provided, such details are non-limiting and that other spin speeds, times, ramp rates and dispense amounts can be employed to achieve a desired film thickness. Furthermore, it will be noted that the experimental data provided does not limit the scope of the embodiments of the present invention. Rather, such data merely illustrate the preparation of composition embodiments in accordance with the present invention as well as for demonstrating the molecular weight lowering discussed above and thus the usefulness of such embodiments.

The following examples illustrate the subject invention. Unless otherwise indicated in the following examples and elsewhere in the specification and claims, all parts and percentages are by weight, all temperatures are in degrees Centigrade, and pressure is at or near atmospheric pressure.

EXAMPLES

Example 1A

PDL20 Formulation

Polylactide (PDL20) (40 g, 18.1 wt. %) was dissolved in (GBL) (180 g). GSID26-1 (tris(4-(4-acetylphenylthio)phenyl)sulfonium tris(trifluoromethanesulfonyl)methide BASF) (0.8 g, 0.4 wt %) was added to the polylactide solution. The viscosity was determined with an E-type viscometer and found to be 20.0 Pa·s at 25° C.

Example 1B

Evaluation of Temporary Wafer Bonding Process

The formulation of Example 1A was spin-coated onto an 8 inch glass wafer after which the coated wafer was soft-baked at 120° C. for 5 minutes and then hard-baked at 220° C. for 5 minutes to give a 40 urn thick film. A device wafer was then bonded to the coated glass wafer using a SB-8e substrate bonder (Suss MicroTec) set at a temperature of 170° C. with a pressure of 0.2 MPa applied for 5 minutes in a vacuum ($10^{-2}$ mbar). The bonded sample was visually inspected and no voids were observed. After the inspection, the device wafer was mounted on a DFG8540 automatic surface grinder (Disco) and thinned to a thickness of 50 um. The bonded stack was the exposed through the glass wafer side using a MA-8 exposure tool (Suss MicroTec) to a dose of 2000 mJ/cm$^2$ at a wavelength of 365 nm. Then the thinned device wafer was then debonded from the glass wafer by a slide-off method using an EVG 805 wafer debonder (EV Group, Austria) set at a slide-off rate of 2.0 mm/sec and a temperature of 170° C. The residue on the device and glass wafers was removed by soaking in GBL at 25° C. with agitation.

Example 2A

Evaluation of Temporary Wafer Bonding Process

The formulation in Example 1A was spin-coated onto an 8 inch glass wafer, the glass wafer bonded to a device wafer, the device wafer thinned and debonded from the glass wafer using the method of Example 1B, except that no hard bake was performed. Any residue on device and glass wafer was removed by soaking in GBL at 25° C. with agitation.

Example 3

Evaluations of poly(lactide) Solutions and Films Formed Thereof

A number of polymer solutions were prepared by dissolving a specific polymer in a specific solvent (see Table 2, below). For each solution having a DL content of 100%, dissolution was achieved by rolling the solvent and polymer mixture overnight at room temperature on a bottle roller. For each solution where the DL content was less than 100%, dissolution was achieved by mixing the solvent and polymer mixture overnight with a mechanical stirrer while heating the bottle with an electric heating mantle set at 50° C. The appearance of the solution was examined visually to determine if the mixture was clear, hazy, or contained gel.

Approximately 5 g of each of the polymer solutions was hand dispensed from the bottle onto the center of a 4-inch silicon wafer mounted on a CEE-spinner from Brewer Science. After the dispensing of each polymer composition was completed, the wafer ramped at a rate of 1000 rpm/sec to 1400 rpm. After 30 sec, wafer rotation was stopped and the wafer put onto a hot plate at 120° C. for 20 min to remove any residual solvent to provide a solid film. The film was examined visually to determine if the film was smooth or rough.

The film was then scratched manually with a blade to the wafer surface near the wafer center. Using a KLA-TENCOR Alpha-step 500 profiler, a single thickness measurement was performed. See Table 2 for results.

TABLE 2

| Grade | IV | DL content | Mw | Solvent | TS (%) | Filtration | Appearance of solution | Appearance of spin coated and soft baked film | Thickness (μm) |
|---|---|---|---|---|---|---|---|---|---|
| PLDL7025 | 2.5 dl/g | 30 | 274K | GBL | 10 | No | Clear | Smooth | 6 |
| PLDL7025 | 2.5 dl/g | 30 | 274K | NMP | 10 | No | Clear | Smooth | 6 |
| PDL20 | 2.0 dl/g | 100 | 330K | NMP | 20 | No | Clear | Smooth | 40 |
| PDL20 | 2.0 dl/g | 100 | 330K | GBL | 20 | No | Clear | Smooth | 40 |
| PLDL7017 | 1.7 dl/g | 30 | 185K | NMP, | 20 | No | Clear | Smooth | 40 |
| PLDL7017 | 1.7 dl/g | 30 | 185K | Cyclohexanone | 20 | No | Clear | Smooth | 40 |
| PLDL7017 | 1.7 dl/g | 30 | 185K | Cyclopentanone | 20 | No | Clear | Smooth | 40 |
| PLDL7017 | 1.7 dl/g | 30 | 185K | GBL | 20 | No | Hazy | Smooth | 40 |
| PLDL7006 | 0.6 dl/g | 30 | 35K | GBL | 30 | No | Gel | Rough | 40 |
| PLDL7006 | 0.6 dl/g | 30 | 35K | GBL | 30 | Yes | Clear | Smooth | 13 |
| PLDL7006 | 0.6 dl/g | 30 | 35K | NMP | 30 | No | Hazy | Smooth | 30 |
| PLDL7008 | 0.8 dl/g | 30 | 43K | GBL | 30 | No | Gel | Rough | 35 |
| PLDL7008 | 0.8 dl/g | 30 | 43K | NMP | 30 | No | Hazy | Rough | 25 |
| PLDL7010 | 1.0 dl/g | 30 | 57K | GBL | 30 | No | Gel | Rough | 10 |
| PLDL7010 | 1.0 dl/g | 30 | 57K | NMP | 30 | No | Clear | Smooth | 30 |
| PLDL8416 | 1.68 dl/g | 16 | 116K | GBL | 30 | No | Not soluble | — | — |
| PLDL8416 | 1.68 dl/g | 16 | 116K | NMP | 30 | No | Not soluble | — | — |
| PDL02 | 0.2 dl/g | 100 | 13.7K | GBL | 50 | No | Clear | Smooth | 23 |
| PDL02 | 0.2 dl/g | 100 | 13.7K | NMP | 50 | No | Clear | Smooth | 20 |
| PDL05 | 0.5 dl/g | 100 | 37.6K | GBL | 30 | No | Clear | Smooth | 32 |
| PDL05 | 0.5 dl/g | 100 | 37.6K | NMP | 30 | No | Clear | Smooth | 27 |
| PDL05 | 0.5 dl/g | 100 | 37.6K | NMP | 50 | No | Clear | Smooth | 115 |
| PDL05 | 0.5 dl/g | 100 | 37.6K | GBL | 45 | No | Clear | Smooth | 48 |
| PDL05 | 0.5 dl/g | 100 | 37.6K | NMP | 45 | No | Clear | Smooth | 38 |

Example 4

Effect of UV Exposure on Mw

A formulation of PLDL7017 and GSID26-1 in NMP (20% Ts, 0.5 phr GSID26-1) was prepared and spin coated onto each of three 4-inch Si wafers. After coating, each wafer was soft baked at 120° C. for 20 min and the thickness of the film determined to be 40 μm. The $M_w$ of polymer in the formulation was determined using GPC (Gel Permeation Chromatography). The film on the first wafer was hard baked at 210° C. for 5 min. The film on the second wafer was hard baked at 200° C. for 5 min. A portion of the film from these two wafers was then scraped from the wafers and the $M_w$ of each scraped portion was determined using GPC.

A formulation of PDL20 and GSID26-1 in GBL (20% Ts, 0.5 phr GSID26-1) was prepared and spin coated onto each of three 4-inch Si wafers. After coating, each wafer was soft baked at 120° C. for 20 min and the thickness of the film determined to be 40 μm. The $M_w$ of PDL20 in the formulation was determined using GPC. The film on the first wafer was hard baked at 170° C. for 5 min. The film on the second wafer was hard baked at 180° C. for 5 min. A portion of the film from these two wafers was then scraped from the wafers and the $M_w$ of each scraped film was determined using GPC.

With UV Exposure:

The third wafer having the PLDL7017/GSID26-1 formulation spun thereon to form a film was then exposed, using an AB-M mask aligner, to a dose of 2 J/cm² at a wavelength of 365 nm followed by hard bake at 200° C. for 5 min. A portion of the film was then scraped from the wafer and the $M_w$ of the scraped portion determined using GPC.

The third wafer having the PDL20/GSID26-1 formulation spun thereon to form a film was then exposed, using an AB-M mask aligner, to a dose of 0.1 J/cm² at a wavelength of 365 nm followed by hard bake at 170° C. for 5 min. A portion of the film was then scraped from the wafer and the $M_w$ of the scraped portion determined using GPC.

The results of each of the six wafers are provided in Table 3, below:

TABLE 3

| Wafer No. | Formulation | UV Exposure | Hard Bake | Original $M_W$ | $M_W$ after hard bake |
|---|---|---|---|---|---|
| | PLDL7017/GSID26-1 | None | 210° C. | 185K | 177K |
| | PLDL7017/GSID26-1 | None | 200° C. | 198K | 211K |
| | PLDL7017/GSID26-1 | 2 J/cm² | 200° C. | 185K | 27K |
| | PDL20/GSID26-1 | None | 170° C. | 342K | 320K |
| | PDL20/GSID26-1 | None | 180° C. | 324K | 311K |
| | PDL20/GSID26-1 | 0.1 J/cm² | 180° C. | 342K | 46K |

Example 5

A formulation of PDL20 and GSID26-1 in GBL (20% Ts, 2 phr GSID26-1) was prepared and spin coated onto a 4-inch Si wafer. After coating the wafer was baked at 120° C. for 20 min to remove residual GBL, blanket exposed to 2000 mJ/cm² of actinic radiation having a wavelength of 365 nm and baked after exposure at 200° C. for 15 min in a $N_2$ purged oven. The weight of the substrate and film was determined after the first bake, after the 2000 mJ/cm² exposure and after the second bake to be 8.66 g, 8.66 g and 8.66 g, respectively. Two additional samples of the above polymer composition were cast onto 4-inch Si wafers by spin coating. A portion of the film was then scraped from one of the samples and the $M_w$ of the scraped portion determined to be 316,800 using GPC. The second sample was exposed, using an AB-M mask aligner, to a dose of 2000 mJ/cm² at a wavelength of 365 nm followed by hard bake at 200° C. for 15 min. A portion of the film was then scraped from the wafer and the $M_w$ of the scraped portion determined to be 25,500 using GPC.

Example 6A

Random MMA-MAA Copolymer

Methyl methacrylate-methacrylic acid (80/20) copolymer (5 g, Monomer-Polymer and Dajac Labs, product number 9425) was dissolved in sufficient cyclopentanone to give a 40 weight percent solution. Approximately 2 g of this solution was hand dispensed onto the center of a 4-inch silicon wafer. The wafer was spun at 1000 rpm for 30 s. The wafer was baked at 120° C. for 20 min. The resulting crack free film was determined to be 48 um thick.

A second portion of methyl methacrylate-methacrylic acid (80/20) copolymer was dissolved in cyclopentanone (17 g) to give a 15 weight percent solution. Approximately 2 g each of this solution was hand dispensed onto the center of two 4-inch silicon wafer. The wafers were spun at 500 rpm for 70 sec. The wafers were baked at 130° C. for 2 min. One wafer was exposed (1 J/cm² at 248 nm) in an Electro-lite Corporation Electro-Cure 4001 UV Flood System equipped with an Electro-lite bulb (part #82058). This wafer was then post exposure baked at 150° C. for 15 min. A sample of polymer was scraped from each of the exposed and the unexposed wafers. GPC analysis of these two polymer samples showed that the Mw of the exposed portion of the polymer was substantially decreased compared to the unexposed portion of polymer. In a separate experiment, another wafer was prepared and exposed as stated above and then submitted for GPC analysis.

TABLE 4

| Sample | Mw | Mn | Mw/Mn |
|---|---|---|---|
| Polymer as received | 33110 | 17181 | 1.93 |
| Unexposed polymer | 31500 | 16800 | 1.88 |
| Exposed polymer | 10200 | 3390 | 3.08 |
| Exposed polymer (repeat) | 5670 | 3060 | 1.85 |

A four inch silicon wafer was weighed with a 4 decimal place analytical balance. A portion of the 15 wt % solution described above was spin coated onto a silicon wafer at 500 rpm for 30 sec. The weight of the wafer was determined after a 120° C. 20 min post apply bake. The entire wafer was exposed (2 J at 248 nm) in an Electro-lite Corporation Electro-Cure 4001 UV Flood System. The weight of the wafer was determined after exposure. The wafer was then post exposure baked at 150° C. for 15 min. Once again, the weight of the wafer was determined.

TABLE 5

| Sample | g |
|---|---|
| Wafer weight prior to polymer solution spinning | 14.4929 |
| Wafer + polymer film weight after post apply bake | 15.2118 |
| Wafer + polymer film weight after exposure | 15.2045 |
| Wafer + polymer film weight after post exposure bake | 15.1534 |

A calculated from the tabulated results, above, the weight of polymer on the wafer after post apply bake was 0.7189 g; after exposure, 0.7116 g; and after post exposure bake 0.6605 g. Throughout the process, the total amount of material lost was minimal, 0.0584 g or approximately 8%.

Example 6B

Three 15 weight percent polymer solutions of methyl methacrylate-methacrylic acid (80/20) copolymer were prepared as above and then one percent, by weight of the polymer, of one of CPTX (1-chloro-4-propoxy-9H-thioxanthone, Lambson Group Inc.), 2,2-dimethoxy-2-phenyl acetophenone (Sigma Aldrich) and benzophenone was added to each solution. Approximately 2 g each of these solutions were hand dispensed onto the center of three separate 4-inch silicon wafer. The wafers were spun at 500 rpm for 70 sec. The wafers were post apply baked at 130° C. for 2 min. The wafers were exposed using an ABM mask aligner (dose 1 J/cm2 at 365 nm). Then the wafers were post exposure baked at 150° C. for 15 min. A sample of polymer was scraped from each of the wafers and submitted for GPC. The experiment was then repeated twice, once with an exposure dose of 10 J/cm2, and once without exposure, for the unexposed samples, the wafers were not post exposure baked. A sample of polymer was scraped from each of the wafers and submitted for GPC. The results of these experiments are shown in the table below.

TABLE 6

| Sample | photosensitizer | Dose (J/cm2) | PEB? | Mw | Mn | Mw/Mn |
|---|---|---|---|---|---|---|
| Polymer as received | — | — | No | 33110 | 17181 | 1.93 |
| Exposed polymer | CPTX | 1 | Yes | 31200 | 17100 | 1.82 |
| Exposed polymer | CPTX | 10 | Yes | 30400 | 16500 | 1.84 |
| Exposed polymer | CPTX | 1 | No | 31400 | 17400 | 1.81 |
| Exposed polymer | CPTX | 10 | No | 30500 | 16600 | 1.83 |
| Exposed polymer | 2,2-dimethoxy-2-phenyl acetophenone | 1 | Yes | 31400 | 17500 | 1.80 |
| Exposed polymer | 2,2-dimethoxy-2-phenyl acetophenone | 10 | Yes | 31000 | 17000 | 1.82 |
| Exposed polymer | 2,2-dimethoxy-2-phenyl acetophenone | 1 | No | 31400 | 17300 | 1.81 |
| Exposed polymer | 2,2-dimethoxy-2-phenyl acetophenone | 10 | No | 31300 | 17100 | 1.83 |
| Exposed polymer | benzophenone | 1 | Yes | 31500 | 17100 | 1.84 |
| Exposed polymer | benzophenone | 10 | Yes | 31800 | 17100 | 1.86 |
| Exposed polymer | benzophenone | 1 | No | 32000 | 17400 | 1.84 |
| Exposed polymer | benzophenone | 10 | No | 31900 | 17400 | 1.83 |

As shown in Table 4, exposure at 248 nm results in significant molecular weight decrease. Table 5 shows that exposure to 248 nm light does not result in an inordinate loss of polymer weight even after post exposure bake, and Table 6 shows that, even with photosensitizers, exposure at 365 nm does not result in a reduction in Mw. Therefore the expected decrease in melt viscosity and debonding temperature would not be expected to occur upon exposure at 365 nm.

Example 6C

Approximately 2 g each of the aforementioned 15 wt. % solution was hand dispensed onto the center of two 4-inch silicon wafer. The wafers were spun at 500 rpm for 70 sec. The wafers were baked at 130° C. for 2 min. One wafer was exposed (1 J/cm2 at 248 nm) using an ABM mask aligner without a 365 nm band pass filter. The other wafer was exposed (10 J/cm2 at 248 nm) using an ABM mask aligner without a 365 nm band pass filter. A sample of polymer was scraped from both wafers. GPC analysis of these two polymer samples showed that the Mw of both polymers did not change significantly from the as received polymer.

TABLE 7

| Sample | Mw | Mn | Mw/Mn |
|---|---|---|---|
| Polymer as received | 33110 | 17181 | 1.93 |
| 1 J/cm2 exposed polymer | 31700 | 17800 | 1.78 |
| 10 J/cm2 exposed polymer | 31600 | 18000 | 1.75 |

Example 7

Methyl methacrylate-butyl acrylate triblock copolymers (LA 2250, LA 4285 and LA 2140e from Kuraray) were dissolved in cyclopentanone solution to make a 40 wt. % solution. Approximately 2 g of each solution was hand dispensed onto the center of a 4-inch silicon wafer. The wafer was spun at 500 rpm for 70 sec. The wafer was baked at 120° C. for 5 min. The film thickness of the resulting crack free films was determined by profilometry.

TABLE 8

| Polymer | LA 2250 | LA 4285 | LA 2140e |
|---|---|---|---|
| Film Thickness (um) | 30.1 | 44.6 | 29.4 |

Approximately 2 g of the 40 wt. % methyl methacrylate-butyl acrylate triblock copolymers (LA 4285 from Kuraray) solution in cyclopentanone as described above was hand dispensed onto the center of each of two 4-inch silicon wafers. The wafers were spun at 500 rpm for 70 sec. The wafers were baked at 120° C. for 5 min. One wafer was exposed (2 J/cm$^2$ at 248 nm) in an Electro-lite Corporation Electro-Cure 4001 UV Flood System equipped with an Electro-lite bulb (part #82058). This wafer was then post exposure baked at 150° C. for 15 min. A sample of polymer was scraped from the exposed and the unexposed wafers. GPC analysis of these two polymer samples showed that the $M_w$ of the exposed portion of the polymer was substantially decreased compared to the unexposed portion of polymer.

TABLE 9

Exposure using Electro-Cure 4001 UV Flood System

| Sample | Mw | Mn | Mw/Mn |
|---|---|---|---|
| Polymer as received | 59900 | 51900 | 1.15 |
| Unexposed polymer | 60000 | 53000 | 1.13 |
| Exposed polymer | 40150 | 4180 | 9.61 |

The above experiment was repeated except the exposure was carried out using an ABM mask aligner (2 J/cm² at 248 nm) without a 365 nm band pass filter. GPC results of the exposed and unexposed polymers are shown in Table 10, below.

TABLE 10

Exposure using ABM mask aligner

| Sample | Mw | Mn | Mw/Mn |
|---|---|---|---|
| Polymer as received | 59900 | 51900 | 1.15 |
| Unexposed polymer | 59600 | 52300 | 1.14 |
| Exposed polymer | 59600 | 52500 | 1.13 |

The Table 9 and 10 data shows that the exposed polymer using the Electro-Cure Flood System results in a drop in molecular weight while the molecular weight of the polymer exposed using the ABM mask aligner is unaffected.

As the above results are unexpected, a subsequent experiment was performed to compare wafer temperatures between exposure using the Electro-lite Corporation Electro-Cure 4001 UV Flood System equipped with an Electro-lite bulb (part #82058) and using the ABM mask aligner without a 365 nm band pass filter. The exposures were performed using blank silicon wafers and a Fisher Scientific Traceable Non-contact Infrared Thermometer to measure the temperature of the silicon wafers before and after exposure. As seen in Table 11, the temperature of the wafer exposed using the UV Flood system was 63° C. higher than that of the wafer exposed using the mask aligner. Therefore it is believed that a combination of exposure and heat resulted in the substantial reduction in Mw.

TABLE 11

| Exposure unit | Temperature before exposure | Temperature after exposure |
|---|---|---|
| Electro-Cure 4001 UV Flood System | 22° C. | 91° C. |
| ABM Mask aligner | 19° C. | 28° C. |

Example 8

An appropriate amount of RV270, an amorphous copolyester, (Toyobo America, Inc.) was dissolved in cyclopentanone along with 0.5 wt. % polymer of GSID26-1 (tris(4-(4-acetylphenylthio)phenyl)sulfonium tris(trifluoromethanesulfonyl)methanide, BASF) to give a 46 weight percent solution. Approximately 2 g of this solution was hand dispensed onto the center of a 4-inch silicon wafer. The wafer was spun at 1800 rpm for 30 sec. The wafer was baked at 120° C. for 5 min resulting in 50 um thick, crack-free film.

Portions of the above RV270 solution were spin coated onto each of two silicon wafers in the manner described above. One wafer was exposed (2 J/cm² at 365 nm) with an AB-M mask aligner system while the other wafer was not. The exposed wafer was then post exposure baked at 200° C. for 5 min on a CEE 1300X hot plate. Polymer samples were scraped off the exposed wafer and the unexposed wafers. The GPC analysis of these two polymer samples, shown in Table 12, demonstrated that the $M_w$ of the exposed polymer was substantially lowered from that of the unexposed polymer.

TABLE 12

| Sample | Mw | Mn | Mw/Mn |
|---|---|---|---|
| Unexposed polymer | 50009 | 23967 | 2.08 |
| Exposed polymer | 17501 | 8853 | 1.97 |

Example 9

An appropriate amount of GK880, an amorphous copolyester, (Toyobo America, Inc.) was dissolved in cyclopentanone along with 1.5 wt. % polymer of GSID26-1 to give a 48 weight percent solution. Approximately 2 g of this solution was hand dispensed onto the center of a 4-inch silicon wafer. The wafer was spun at 1800 rpm for 30 sec and then baked at 120° C. for 5 min resulting in 30 um thick, crack-free film.

Portions of the above GK880 solution were spin coated onto each of two silicon wafers in the manner described above. One wafer was exposed (2 J/cm² at 365 nm) with an AB-M mask aligner system while the other wafer was not. The exposed wafer was then post exposure baked at 200° C. for 5 min on a CEE 1300X hot plate. Polymer samples were scraped off the exposed wafer and the unexposed wafers. The GPC analysis of these two polymer samples, shown in Table 13, demonstrated that the $M_w$ of the exposed polymer was substantially lowered from that of the unexposed polymer.

TABLE 13

| Sample | Mw | Mn | Mw/Mn |
|---|---|---|---|
| Unexposed polymer | 55883 | 18875 | 2.96 |
| Exposed polymer | 10423 | 4788 | 2.17 |

A four inch silicon wafer was weighed with a 4 decimal place analytical balance. A portion of the RV270 solution was applied to a silicon wafer in the manner described above. The weight of the wafer was measured after the 120° C., 5 min post apply bake. The entire wafer was exposed (2 J at 365 nm) with an ABM mask aligner with a band pass filter. The weight of the wafer was determined after exposure. The wafer was then post exposure baked at 200° C. for 5 min on a CEE 1300X hot plate. Once again, the weight of the wafer was determined. As shown in Table 14, the weight of the wafer+polymer is essentially unchanged.

TABLE 14

| Sample | g |
|---|---|
| Wafer + polymer film weight after post apply bake | 9.1678 |
| Wafer + polymer film weight after exposure | 9.1666 |
| Wafer + polymer film weight after post exposure bake | 9.1640 |

Example 10

A terpolymers of 1,3-cyclohexanedicarboxylic acid, 1,4-cyclohexanedicarboxylic acid and 2,2-dimethyl-1,3-propanediol was prepared under catalyzed condensation reaction conditions as described below. In a dry box, the three monomers (all purchased from Sigma Aldrich) were weighed and added to a 250 ml of round bottom flask equipped with a stir bar. The monomer mixture contained 25.0 g (0.145 mol) of 1,4-cyclohexanedicarboxylic acid, 13.0 g (0.076 mol) of 1,3-cyclohexanedicarboxylic acid, and 25.3 g (0.243 mol) of 2,2-dimethyl-1,3-propanediol. Then, 0.073 g of triethylamine and 0.26 g of titanium (IV) 2-ethyl-hexyloxide were added respectively. The reaction set-up was assembled in the hood with the reaction flask connected to a vacuum line in a way that the vacuum could be controlled under a $N_2$ atmosphere. The reaction mixture was heated to 200° C. for 100 min. at 1 atm with water from the reaction being collected in a cold trap. Then the pressure was reduced to 4 Torr and the reaction was held for an additional 2 hr. The temperature was further increased to 230° C. and the pressure was further decreased to 0.5 Torr and allowed to react for an additional 6 hr before it was stopped. GPC analysis showed the product having an Mw of 62,226, Mn of 31,234, and PDI of 1.99.

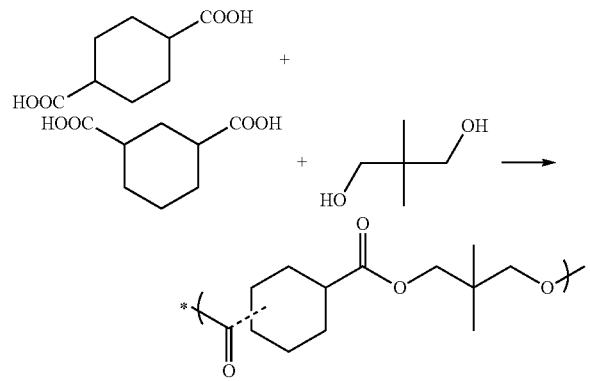

To test the film forming quality of the above terpolymer, an appropriate amount was dissolved in cyclohexanone to give a 45 wt. % solution. The solution was then filtered through a 0.45 μm PTFE filter and a portion hand dispensed onto a silicon wafer and spin coated thereon at 700 rpm for 30 sec. After a 5 min bake at 120° C. a crack free, 40 μm film was obtained.

Portions of the terpolymer solution were then further formulated with one of TPS-C1 (5 phr) for 248 nm exposure and GSID26-1 (2 phr) for 365 nm exposure, respectively. A silicon wafer was then coated with each solution, as described above, and then exposed at 248 nm (2 J/cm²) and 365 nm (2 J/cm²) accordingly. For the formulation using TPS-C1, the Electro-lite Corporation Electro-Cure 4001 UV Flood System equipped with an Electro-lite bulb (part #82058) was used for exposure. For the formulation using GSID26-1 the AB-M mask aligner system equipped with a band pass filter was used for exposure. The molecular weights of each polymer was determined by GPC analysis before and after exposure and reported in Tables 15 and 16, respectively.

TABLE 15

| Exposure at 365 nm | | | |
| --- | --- | --- | --- |
| Sample (5phr TPSC-1) | Mw | Mn | Mw/Mn |
| Unexposed polymer | 56247 | 27182 | 2.07 |
| Exposed polymer | 15781 | 6483 | 2.43 |

TABLE 16

| Exposure at 248 nm | | | |
| --- | --- | --- | --- |
| Sample (2phr GSID26-1) | Mw | Mn | Mw/Mn |
| Unexposed polymer | 57057 | 32012 | 1.78 |
| Exposed polymer | 44980 | 24479 | 1.84 |

As the lowering of the Mw for the terpolymer formulation having a 2 phr GSID26-1 loading was less than anticipated, a formulation having 8.3 phr GSID26-1 was prepared as this loading is the molar equivalent of the 5 phr TPSC-1 loading in the other formulation. A wafer coated with this new solution was prepared and exposed as before and the molecular weight of exposed and unexposed samples determined. As shown in Table 17, the $M_w$ demonstrated by the exposed polymer was essentially equivalent to the lowering seen for the 5 phr TPSC-1 solution reported in Table 15 (31% v. 28%).

TABLE 17

| Sample (8.3phr GSID26-1) | Mw | Mn | Mw/Mn |
| --- | --- | --- | --- |
| Unexposed polymer | 58785 | 26045 | 2.26 |
| Exposed polymer | 18013 | 4581 | 3.93 |

Example 11

Ethyl cellulose (15 g, Aldrich, 48% ethoxyl content) was dissolved in an 80:20 mixture of toluene (68 g) and ethanol (17 g) to give a 15 weight percent solution. Approximately 2 g of this solution was hand dispensed onto the center of a 4-inch silicon wafer. The wafer was spun at 500 rpm for 70 sec. The wafer was baked at 120° C. for 5 min resulting in a crack-free 22 μm thick film.

Another ethyl cellulose formulation was prepared with NMP/butanol as the solvent and a TPS-C1 photoacid generator (PAG) as follows: ethyl cellulose (1.00 g, Aldrich, 48% ethoxyl content) was dissolved in NMP (3.2 g) and butanol (0.8 g) along with TPS-C1 (0.05 g) to give an approximate 20 wt. % solution of ethyl cellulose with approximately 5 wt. % PAG on the polymer.

This second formulation was then spin coated onto a silicon wafer as described above and half the wafer exposed (2 J/cm² at 248 nm) in an Electro-lite Corporation Electro-Cure 4001 UV Flood System while the other half was not exposed. The whole wafer was then post exposure baked at 150° C. for 15 min. A sample of polymer was scraped off of the exposed and the unexposed portions of the wafer and the Mw of each determined by GPC analysis. The molecular weight of each sample are shown in Table 18, below.

TABLE 18

| Sample | Mw | Mn | Mw/Mn |
| --- | --- | --- | --- |
| Polymer as received | 143000 | 48600 | 2.93 |
| Unexposed polymer | 101000 | 42100 | 2.39 |
| Exposed polymer | 57400 | 3390 | 16.9 |

As it can be seen the exposed polymer exhibited substantial $M_w$ lowering.

A four inch silicon wafer was weighed with a 4 decimal place analytical balance. A portion of the second ethyl cellulose solution was spin coated onto a silicon wafer as described above. The weight of the wafer was measured after the 120° C. 5 min post apply bake. The entire wafer was then exposed (2 J at 248 nm) in an Electro-lite Corporation Electro-Cure 4001 UV Flood System equipped with an Electro-lite bulb (part #82058) and the weight of the wafer measured. The wafer was then post exposure baked at 150° C. for 15 min and once again the weight of the wafer measured. The several weights are provided in Table 19, below.

TABLE 19

| Sample | g |
|---|---|
| Wafer weight prior to polymer solution spinning | 9.8543 |
| Wafer + polymer film weight after post apply bake | 10.3029 |
| Wafer + polymer film weight after exposure | 10.2929 |
| Wafer + polymer film weight after post exposure bake | 10.2799 |

As the data in Table 19 indicates, the total weight loss of polymer is minimal.

A portion of the second ethyl cellulose formulation was spin coated onto a silicon wafer as described above. One half of the wafer was exposed (2 J/cm$^2$ at 248 nm) with an ABM mask aligner without a 365 nm band pass filter while the other half was not exposed. The whole wafer was then post exposure baked at 150° C. for 15 min. A sample of polymer was scraped off of the exposed and the unexposed portions of the wafer and the Mw of each determined by GPC analysis. The molecular weight of each sample are shown in Table 20, below.

TABLE 20

| Sample | Mw | Mn | Mw/Mn |
|---|---|---|---|
| Unexposed polymer | 115,000 | 23600 | 4.88 |
| Exposed polymer | 114,000 | 32500 | 3.51 |

As the data in Table 20 indicates, $M_w$ is essentially unchanged between the exposed and unexposed polymer samples.

Example 12

Bi-Layer Example

First polymer layer: Commercial poly(lactide) (PLD20; PURAC biochem BV)(40 g, 22.1 wt. %) was dissolved in gamma-butyrolactone (GBL)(140 g). Tris(4-(4-acetylphenylthio)phenyl)sulfonium tris(trifluoromethanesulfonyl)methide (GSID26-1; BASF)(0.8 g, 0.4 wt. %) was added to the poly(lactide solution and the viscosity, 20 Pas at 25° C., determined with an E-type viscometer.

Second polymer layer: A norbornene-type polymer derived from hexyl norbornene and AOAO norbornene was prepared by well known vinyl addition polymerization (see, U.S. Pat. No. 8,053,515 and U.S. Pat. No. 7,932,161, the pertinent parts of which are incorporated herein by reference), was dissolved in GBL to form a non-photosensitive polymer solution.

The formulation of the first polymer layer was spin-coated onto a 8 inch glass wafer. The coated wafer was soft-baked at 180° C. for 20 minutes in oven to give a 5 urn film. The formulation of the second polymer layer was spin-coated over the first polymer layer providing a double-coated glass wafer. The double coated glass wafer was then soft-baked at 120° C. for 20 minutes in oven to give a 70 um thick bi-layer film thereon.

A device wafer was then bonded to the coated wafer (to the second polymer layer) using the substrate bonder SB-8e (Suss MicroTec) at 250° C. with pressure of 0.6 MPa applied for 5 minutes in a vacuum (below 10$^{-2}$ mbar). The bonded wafer stack was visually inspected through the glass wafer and no voids were observed.

After the inspection, the wafer stack was set onto a wafer grinder DFG8540 (Disco) with the device wafer positioned for wafer thinning and then thinned to a final thickness of 50 um. After removal from the grinder, the wafer stack was exposed through the glass wafer to actinic radiation using MA-8 (Suss MicroTec) mask aligner; the exposure dose was 2000 mJ/cm$^2$ at a wavelength of 365 nm. The thinned device wafer was then released from the glass wafer by a slide-off method using an EVG 805 debonder (EV group) set at a slide-off rate of 2.0 mm/sec and a temperature of 160° C.

The residue on the device and glass wafer was removed by soaking in GBL at 25° C. with agitation until all residue was removed.

By now it should be understood that the present disclosure demonstrates a variety of types of polymers that can advantageously be employed to form a temporary (releasable) bond between a device wafer and a glass substrate. Further it has been shown that such a release can be effected at a temperature at or below the temperature at which the temporary bond was formed. Still further is has been shown that a variety of polymer types can undergo depolymerization that provides for the release of the device wafer from the glass substrate where such depolymerization is characterized by a significant lowering of a polymer's $M_w$ and the attendant lowering of the polymer's viscosity, thus allowing for either slide-off or wedge-off debonding to be accomplished. Exemplary polymer types that can undergo depolymerization include, but are not limited to, PLA polymers, polycarbonates, polyesters, polyamides, polyethers, polymethacrylates, polynorbornenes, alkylcelluloses and combinations of two or more thereof.

While the disclosure has been explained in relation to certain embodiments, it is to be understood that various modifications thereof will become apparent to those skilled in the art upon reading the specification. Therefore, it is to be understood that the disclosure of the various embodiments hereinabove is intended to cover such modifications as such will necessarily fall within the scope of the appended claims. For example, while specific spin coating parameters were provided in the above examples, one of ordinary skill in the art will understand that by varying such parameters (e.g. dispense volume and method, choice of casting solvent, viscosity, exhaust, acceleration, spin speed and time) it is possible to form thicker or thinner bonding layers than disclosed hereinabove.

What is claimed is:

1. A polymer composition for temporary wafer bonding, comprising:
   a polymer having at least one type of repeating unit derived from a lactide-type monomer, said polymer having a first weight average molecular weight (Mw);
   a casting solvent;
   a photoacid generator; and
   wherein said polymer is capable of depolymerizing to a lower second Mw upon exposure to an actinic radiation at a wavelength of 248 nm or 365 nm.

2. The polymer composition of claim 1 further comprising an adhesion promoter.

3. The polymer composition of claim 2, wherein said adhesion promoter is selected from the group consisting of: bis[(3-triethoxysilyl)propyl]disulfide, allyl trimethoxysilane, and 1,6-bis(trimethoxysilyl)hexane.

4. The polymer composition of claim 1, wherein said casting solvent is selected from gamma-butyrolactone, N-methyl-pyrrolidone, propylene glycol monomethyl ether acetate, di-methyl-acetamide, cyclopentanone or a mixture thereof.

5. The polymer composition of claim 1, wherein said casting solvent is gamma-butyrolactone.

6. The polymer composition of claim 1, further comprising one or more polymer selected from the group consisting of: polynorbornene, poly(methyl norbornene), poly(ethyl norbornene), poly(butyl norbornene), poly(hexyl norbornene), poly(decyl norbornene), poly(phenethyl norbornene), poly(triethoxysilyl norbornene), poly(trimethylsilyl norbornene), poly(trimethoxysilyl norbornene), poly(methyldimethoxysilyl norbornene), poly(dimethyl methoxy norbornene), a norbornene/triethoxysilyl norbornene polymer, a butyl norbornene/triethoxysilyl norbornene polymer, and a decyl norbornene/triethoxysilyl norbornene polymer.

7. The polymer composition of claim 1, wherein said photoacid generator is selected from the group consisting of:
triphenylsulfonium tris[(trifluoromethyl)sulfonyl]methanide;
triphenylsulfonium 4,4,5,5,6,6-hexafluorodihydro-4H-1,3,2-dithiazine 1,1,3,3-tetraoxide (TPS N3);
triphenylsulfonium tris[(trifluoromethyl)sulfonyl]methanide (TPS C1);
tris[4-[(4-acetylphenyl)thio]phenyl]sulfonium tris[(trifluoromethyl)sulfonyl]methanide (GSID26-1);
(2-(4-methoxynaphthalen-1-yl)-2-oxoethyl)dimethylsulfonium tetrakis(pentafluorophenyl)borate (TAG 382);
(2-(4-methoxynaphthalen-1-yl)-2-oxoethyl)dimethylsulfonium tris[(trifluoromethyl)sulfonyl]methanide; and
(2-(4-methoxynaphthalen-1-yl)-2-oxoethyl)dimethylsulfonium trifluorotris(1,1,2,2,2-pentafluoroethyl)phosphate.

8. The polymer composition of claim 1, wherein said photoacid generator is tris[4-[(4-acetylphenyl)thio]phenyl]sulfonium tris[(trifluoromethyl)sulfonyl]methanide (GSID26-1).

9. The polymer composition of claim 1, wherein said photoacid generator is triphenylsulfonium tris[(trifluoromethyl)sulfonyl]methanide (TPS C1).

10. The polymer composition of claim 1, wherein said one or more polymer is having a weight average molecular (Mw) in the range of from about 10,000 to 500,000.

11. A process for temporary bonding comprising;
casting a polymer composition comprising a polymer having at least one type of repeating unit derived from a lactide-type monomer and one of a photoacid generator or a photosensitizer to form a temporary bonding layer over a first surface of a first substrate, said polymer having a first weight average molecular weight ($M_w$);
thermocompression bonding said first substrate to a second substrate at a first temperature where said temporary bonding layer is disposed between the first surface of the first substrate and a first surface of said second substrate;
performing a process directed to a second surface of one of said first substrate or said second substrate;
exposing the temporary bonding layer to a dose of actinic radiation at a wavelength of either 248 nm or 365 nm, said dose sufficient to cause the first $M_w$ to be lowered to a second $M_w$; and
debonding said first substrate from said second substrate at a second temperature equal to or less than the first temperature and wherein said first temperature is at or below 200° C.

12. The process of claim 11 wherein said debonding is one of slide debonding or wedge debonding.

13. The process of claim 11 wherein said debonding is slide debonding.

14. The process of claim 11 wherein said debonding is wedge debonding.

15. The process of claim 11 wherein said polymer composition further comprises a casting solvent.

16. The process of claim 11 wherein said solvent is selected from gamma-butyrolactone, N-methyl-pyrrolidone, propylene glycol monomethyl ether acetate, di-methyl-acetamide, cyclopentanone or a mixture thereof.

17. The process of claim 11, wherein said casting solvent is gamma-butyrolactone.

18. The process of claim 11 wherein said polymer composition further comprises at least one of an adhesion promoter.

19. The process of claim 11, wherein said photoacid generator is selected from the group consisting of:
triphenylsulfonium tris[(trifluoromethyl)sulfonyl]methanide;
triphenylsulfonium 4,4,5,5,6,6-hexafluorodihydro-4H-1,3,2-dithiazine 1,1,3,3-tetraoxide (TPS N3);
triphenylsulfonium tris[(trifluoromethyl)sulfonyl]methanide (TPS C1);
tris[4-[(4-acetylphenyl)thio]phenyl]sulfonium tris[(trifluoromethyl)sulfonyl]methanide (GSID26-1);
(2-(4-methoxynaphthalen-1-yl)-2-oxoethyl)dimethylsulfonium tetrakis(pentafluorophenyl)borate (TAG 382);
(2-(4-methoxynaphthalen-1-yl)-2-oxoethyl)dimethylsulfonium tris[(trifluoromethyl)sulfonyl]methanide; and
(2-(4-methoxynaphthalen-1-yl)-2-oxoethyl)dimethylsulfonium trifluorotris(1,1,2,2,2-pentafluoroethyl)phosphate.

20. The process of claim 11, wherein said exposing causes the photoacid generator (PAG) to generate an acid that reacts with the polymer backbone to cause molecular weight lowering.

* * * * *